United States Patent [19]

Pricer

[11] Patent Number: 5,673,005

[45] Date of Patent: Sep. 30, 1997

[54] TIME STANDARD CIRCUIT WITH DELAY LINE OSCILLATOR

[75] Inventor: W. David Pricer, Charlotte, Vt.

[73] Assignee: International Business Machine Corporation, Armonk, N.Y.

[21] Appl. No.: 516,852

[22] Filed: Aug. 18, 1995

[51] Int. Cl.$^6$ .................................. H03K 5/13; H03L 7/00

[52] U.S. Cl. .......................... 331/1 R; 331/111; 331/143; 331/57; 327/182; 327/277; 327/276; 327/244; 327/284

[58] Field of Search ...................................... 327/276, 272, 327/278, 280, 281, 72, 68, 182, 284, 231, 233, 234, 244, 236, 237; 331/1 R, 25, 1 A, 57, 74, 111, 143; 375/371

[56] References Cited

U.S. PATENT DOCUMENTS 4,899,071  2/1990  Morales ........................... 327/281 X Primary Examiner—Robert Pascal
Assistant Examiner—Arnold Kinkead
Attorney, Agent, or Firm—Thornton & Thornton; Robert A. Walsh

[57] ABSTRACT

This is an integrated timing circuit which can be formed on a microprocessor chip. The circuit uses an oscillator having a delay line and a variable delay element. The delay line and the delay element vary together to hold the velocity of signal propagation in the circuit substantially constant. The output of the oscillator is coupled to one input of a comparator circuit. A series of inverter circuits, each of which has a respective variable delay are connected to the input of the oscillator and to a second input of the comparator circuit such that the comparator circuit senses the difference between the output signal of the inverter series and the output signal of the oscillator circuit to provide an error signal proportional to the sensed difference. A feedback loop is provided, to the variable delay means in said oscillator and to the inverter circuits to correct for the sensed difference, to establish a uniform and stable time standard at the output of the oscillator.

16 Claims, 9 Drawing Sheets

5,673,005

TIME STANDARD CIRCUIT WITH DELAY LINE OSCILLATOR

FIELD OF THE INVENTION

This invention relates generally to timing circuits and especially to high speed timing circuits required by microprocessors and other integrated circuits. More particularly, the invention relates to a timing circuit that employs the self tuning of an oscillator in conjunction with a delay to provide an accurate delay block and oscillator frequency.

BACKGROUND OF THE INVENTION

Early Microprocessors used simple off-chip crystal controlled oscillators to provide clock pulses for both the necessary microprocessor functions and other system functions. To achieve this, long chains of inverter circuits were typically used to produce phased delays of the master clock for various circuit functions. This worked very well for low clocking speeds and the relaxed timing standards of early machines.

With advances in semiconductor performance, the microprocessors, with the aid of clock doubler or tripler circuits, were made to operate at twice or trice the speed of the crystal controlled oscillators while maintaining synchronization to the slower clock. However, with further advances in semiconductor circuitry the microprocessors became faster still and even tighter time standards were needed. To meet these needs the phase locked loop circuit, such as shown in U.S. Pat. No. 4,912,433, was developed and is now widely used.

More recently, however, still further advances in the semiconductor field make the phase locked loop marginal in some cases.

Also battery driven lap-top personal computers, being dependent on battery life require a so called sleep mode when inactive. However, when woken, the computer must start up and re-synchronize quickly placing an even greater burden on the system. The presently available phase locked loop circuits, which at best are very sensitive and notoriously finicky, fail to satisfy this critical need.

SUMMARY OF THE INVENTION

Accordingly, the invention provides a new, and unique means for providing a uniform and more stable time standard than is presently available even with the best of phase locked loop circuits.

The invention further provides a timing circuit for microprocessors that can be built on the microprocessor chip and which does not require a phase locked loop circuit.

The present invention still further provides an integrated timing circuit that is independent of its voltage supply, the temperature of its environment and of variations in the process used to produce the integrated circuit.

These and other features of the present invention are realized by coupling an oscillator, containing a fixed delay line, to a comparator circuit together with a variable delay inverter such that the comparator circuit can sense the difference between the output of the variable delay inverter and the output of the oscillator to provide an error signal proportional to the difference between the compared signals and feed the error signal back to the oscillator and to the variable delay inverter to establish a uniform and stable time standard at the oscillator output.

Thus the invention lies in feeding back the error signal not just to the variable delay inverter circuit, in which case it would be similar to the phase locked loop, but also to the oscillator.

The present invention thus self tunes the oscillator and delay to provide an accurate delay block and oscillator frequency.

The present invention thus overcomes all the difficulties encountered with the prior art timing and phase locked loop circuits.

The present invention can also be expanded such that new and improved applications such as timing chains, set up and hold circuits, oscillators, clocks, and pulse generators are readily achievable especially in the realm of integrated circuits.

Also the present invention permits the easy generation of sub-clock pulses by counting down from the oscillator and using master-slave techniques to eliminate skew by re-synchronizing the sub-clocks to the oscillator.

The present invention further teaches a means and a method of adjusting the frequency of the oscillator during or after its fabrication.

These and other objects and features of the present invention will become further apparent from the following description taken in conjunction with the drawings.

DESCRIPTION OF THE PREFERRED EMBODIMENT

The present invention employs the self tuning of an oscillator with a delay line to provide an accurate delay block and oscillator frequency.

The present invention accomplishes this by coupling a variable delay inverter circuit and a comparator to an oscillator so that any error signal can be fed back to the inverter circuit and the oscillator and thus be corrected for. The variable delay inverter circuit includes a variable delay element that will generate a maximum delay that is short compared to the time it takes a signal to pass through the inverter element but equal to the tolerance in the overall inverter transmission delay.

The present invention thus relies upon closely matched inverter circuits, which are capable of driving transmission lines and which are large enough to insure a level of uniformity. The inverter circuits, when the circuit is formed as an integrated circuit, can be located near each other.

Basically, the present invention need only use a basic oscillator consisting of a single inverter in a closed loop with a delay line. The period of oscillation is compared, by a differential comparator circuit, to the delay down an odd number of inverters which might or might not include the inverter of the oscillator.

Figure 1:
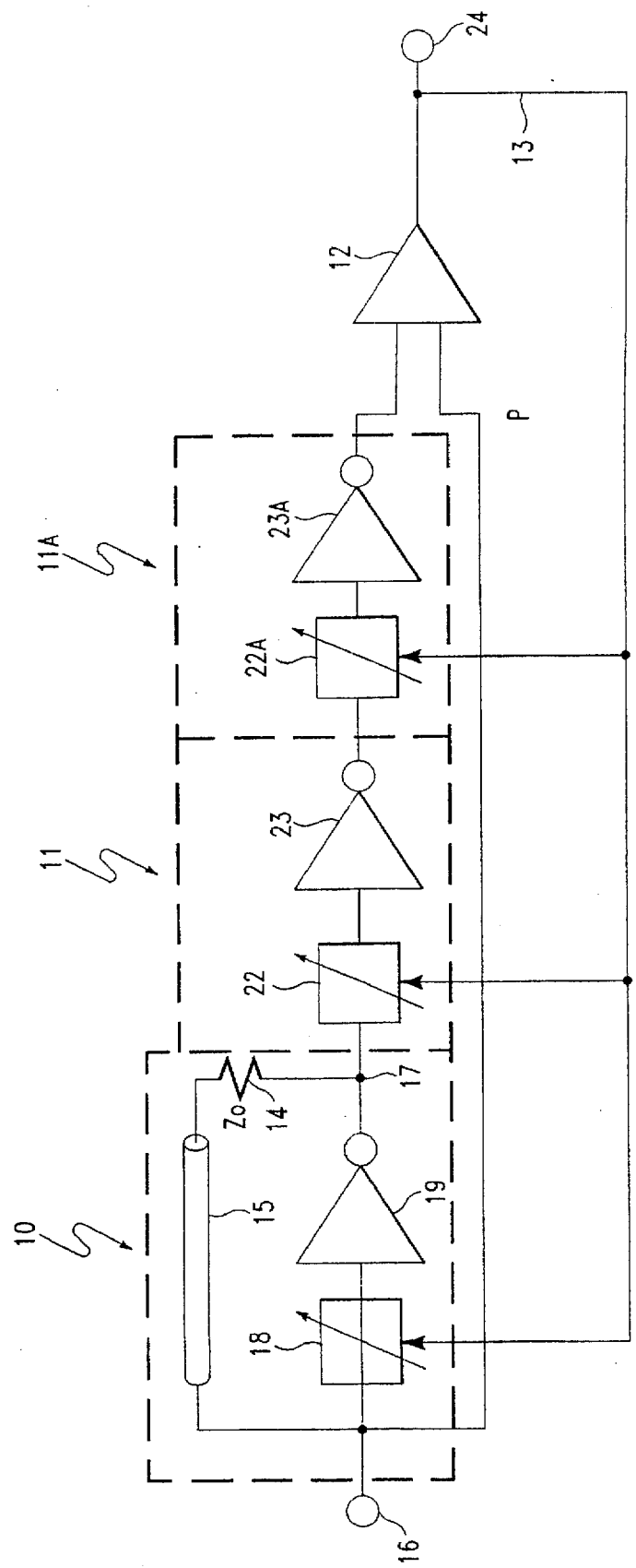
FIG. 1 is a schematic of a circuit illustrating the principles of the present invention.

FIG. 1 shows a basic configuration of the time standard circuit of the present invention wherein the delay is established by an odd number of inverters which includes the inverter of the oscillator. The circuit shown schematically in FIG. 1 basically comprises an oscillator 10, coupled through two variable delay inverter circuits 11 and 11A, to a comparator circuit 12, shown here as differential mode, to provide an error signal which is coupled through a feedback loop 13 to each of the variable delay inverter circuits 11, 11A and the oscillator.

More specifically, the oscillator 10, is comprised of a delay line 15, coupled in series with an impedance 14, positioned between an input 16, and an output 17. A variable delay element 18, coupled in series with an inverter 19, is arranged, in parallel with the delay line 15 and the impedance 14, between the input 16 and the oscillator output 17. The output 17, of the oscillator 10, is coupled through the variable delay circuits 11 and 11A, to a first input of the differential comparator 12. These variable delay circuits 11 and 11A are identical and each includes a variable delay element 22, 22A and an inverter 23, 23A. The second input of the differential comparator 12 is connected to the oscillator input 16. The output of the differential comparator 12 is coupled to the feedback line 13.

In this arrangement, each variable delay circuit 11, 11A adds an additional small variable delay factor. The output error signal on feedback line 13 adjusts the variable delay elements until the delays down the three variable delay circuits 10,11, 11A just equal the delay down the transmission line, plus the variable delay circuit 10. At this point the delay of the variable delay circuit equals half the delay of the entire transmission line.

It should be noted that any comparator circuit such as may presently be found in conventional phase locked loop circuits can be employed. The comparator circuit selected should generate a sufficiently large error signal to correct for most of the differences of the delay within a single cycle and the gain should not be so high as to create instabilities in the feedback loop.

It can be readily shown an improved time standard circuit can be created wherein, instead of using a difference comparator to compare two signals, one signal is added to the complement of the other signal. By using this additive technique significant advantages, as will be discussed below become available.

This improved time standard circuit again uses a basic oscillator as a single inverter in a closed loop with an electrical delay line. Again the period of the oscillation is compared, now, however, a summation circuit and a sample and hold circuit is used, to compare the input signal to the signal delayed by transmittal through an even number of inverters.

Figure 2:
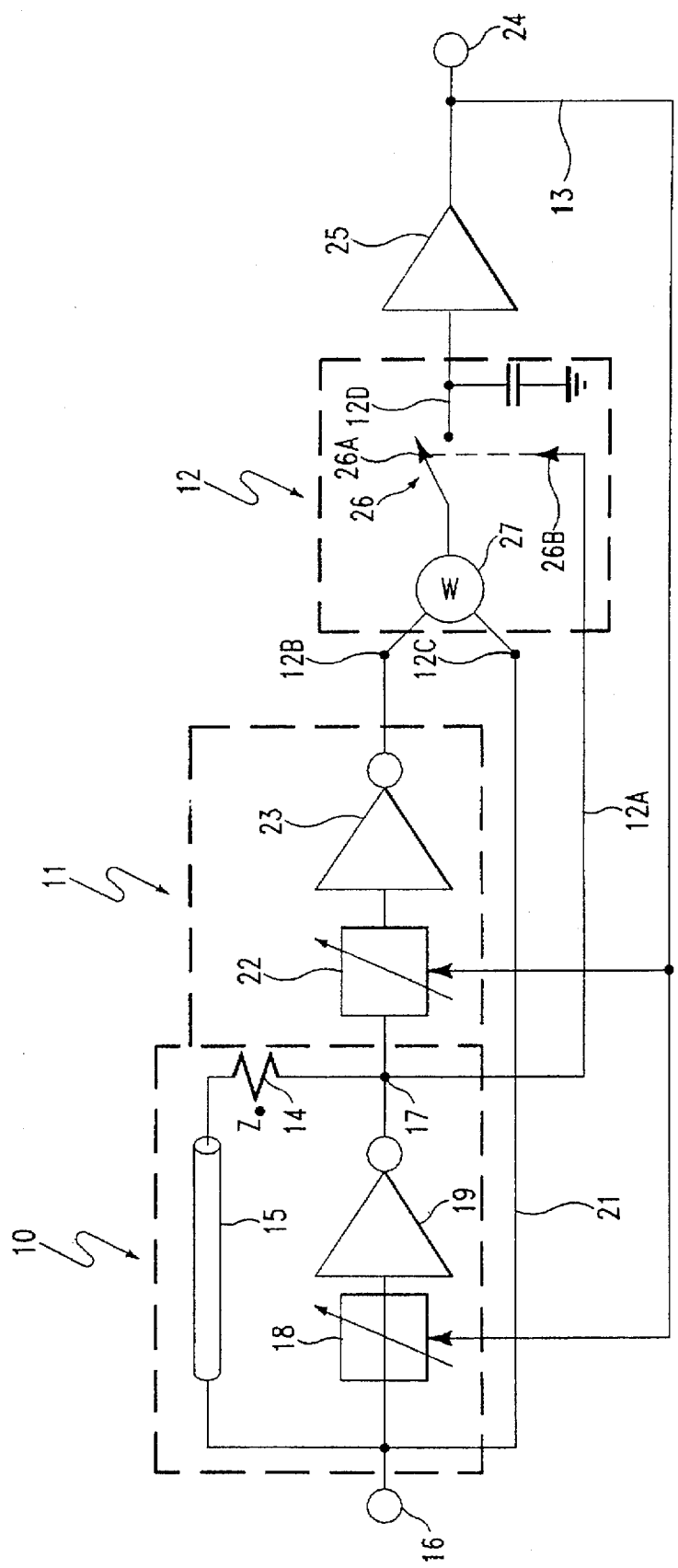
FIG. 2 is a schematic of a more simplified circuit illustrating the principles of the present invention.

Turning now to FIG. 2, the basic elements of the preferred embodiment of present invention is shown, in schematic form. FIG. 2 basically comprises an oscillator 10, coupled through a variable delay inverter circuit 11, to a comparator circuit 12 and amplifier 25. Preferably the comparator circuit 12 and amplifier 25 selected will be designed to generate a sufficiently large error signal to correct for most of the delays within a single cycle and to prevent any significant short term frequency instability but should not be so large as to create instabilities in the feedback loop. In the present example, the comparator circuit 12 is formed of a summation circuit and a sample and hold circuit 26. The comparator circuit 12 and amplifier 25 provide an error signal which is coupled through a feedback loop 13 to the variable delay inverter 11 and the oscillator 10.

More specifically, as in FIG. 1, the oscillator 10, is comprised of a delay line 15, coupled in series with an impedance 14, positioned between an input 16, and an output 17. A variable delay element 18, coupled in series with an inverter 19, is arranged, in parallel with the delay line 15 and the impedance 14, between the input 16 and the oscillator output 17. The output 17, of the oscillator 10, is coupled by a line 21, directly to a first input 12A of the comparator 12 and through the inverter circuit 11, to a second input 12B, of the comparator 12. The third input 12C of the comparator 12 is connected to the oscillator input 16 and its output 12D is coupled to the input of a frequency compensated amplifier 25 whose output 24 is coupled to the feedback line 13.

In the preferred embodiment, the variable delay circuit 11, is comprised of a variable delay element 22 in series with an inverter 23, and has an input coupled to the output 17, of the oscillator 10, and an output coupled to the second input 12B, of the comparator 12.

The error signal, appearing at the output 12D of the comparator circuit 12 is coupled through a frequency compensated amplifier 25 to the output 24 and via the feedback line 13 to the variable delay elements 18 and 22. In some instances, as will be further explained below in conjunction with FIG. 6, it may be desirable to provide in addition to the error signal appearing on line 13 its complimentary signal on line 13A. This complimentary signal can be easily be provided by connecting an additional amplifier 25A to the output of amplifier 25. The amplifier 25 should have unity gain and signal inversion.

Preferably the comparator 12 of the present invention has three inputs and is formed of a summation circuit 27 coupled to a sample and hold circuit 26.

The output 12B of the variable delay inverter circuit 11 is coupled to a first input of the summation circuit 27. The signal input 16 is connected to the second input 12C of the summation circuit. With these inputs the summation circuit 27 senses the difference between the signal arriving at input 16, with the same signal after it has passed through variable delay element 18, inverter 19 and the variable delay inverter circuit 11. This difference, i.e., the output error signal is now filtered through to the sample and hold circuit 26. The output 17 of oscillator 10 controls the sample time. The output of the sample and hold circuit is now passed through the output amplifier 25 to the feedback line 13.

The circuit shown in FIG. 2 has three main advantages over the circuit shown in FIG. 1.

They are:

1. The electric delay line now needs to have a delay of only one inverter circuit rather than two such circuits thus the delay line is shorter and simpler which is important when designing the delay line on a integrated circuit chip;
2. The frequency of oscillation is higher so the granularity of the clock phases generated may be finer and fresh error signals may be generated more rapidly assuring faster corrections to the oscillator frequency; and
3. The performance demands on the comparator circuit is less because the comparison is made first with a summation circuit which is an inherently high performance circuit.

Thus the invention lies in feeding back the error signal not just to the variable delay inverter circuit 11, in which case it would be similar to the phase locked loop, but also to the oscillator 10 and thus constantly adjusting and resetting the oscillator output so that it remains free of error.

The variable delay elements and the inverter circuits required by the present invention both in the oscillator and in the variable delay inverter circuit are preferably identical to one another.

In any event, the variable inverter circuit 11 must be capable of driving any transmission line coupled thereto and be large enough to assure a level of uniformity.

Figure 3:
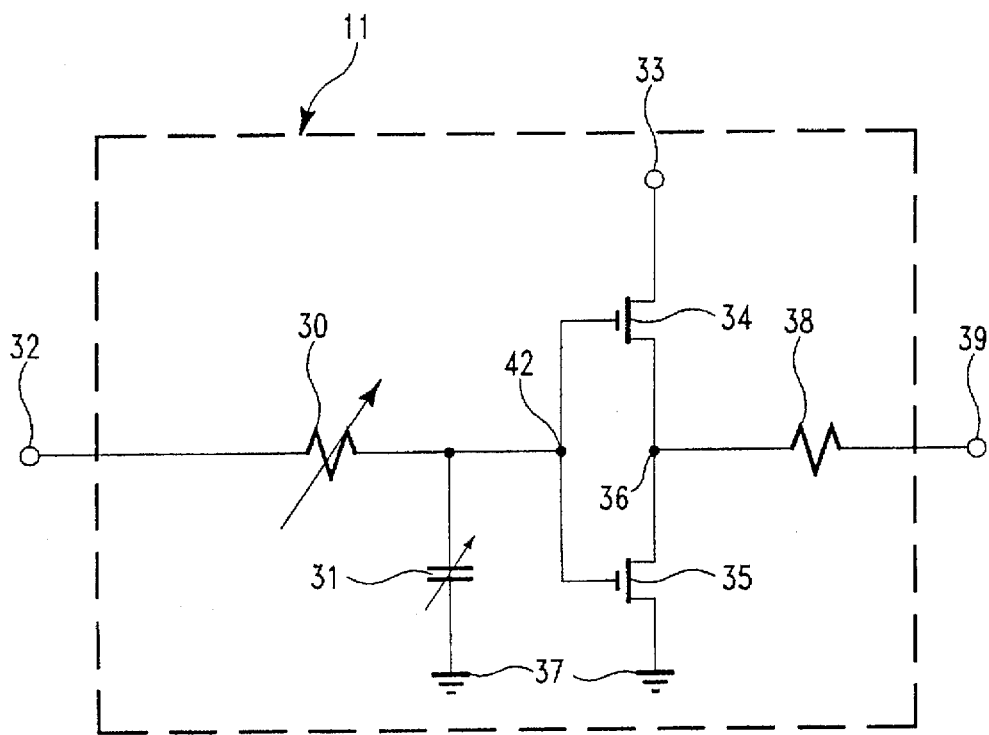
FIG. 3 is a schematic of a variable delay inverter useful in the present invention.

FIG. 3, shows in schematic form, a generalized embodiment of the variable delay and inverter circuit 11, that may be used with the present invention. As noted above the variable delay circuit 11 is comprised of the variable delay element 22 in series with the inverter circuit 23. The variable delay element 22, as shown in this FIG. 3, comprises a resistor 30 and a capacitor 31 coupled to the input of the inverter 23 which is comprised of a pair of CMOS transistors 34 and 35. Transistor 34 is a P channel transistor and transistor 35 is an N channel transistor. These transistors 34 and 35 are coupled between a voltage source 33 and ground 37. The outputs of the transistors 34 and 35 are coupled to each other by a common node 36 and through an output resistor 38 to a driving point 39.

In the delay element 22, the resistor 30 may be variable as shown and is coupled between the delay circuit input 32 and the gates of both the inverter transistors 34 and 35, via a node 42, and to ground 37 through the capacitor 31 which may also be variable as shown.

The load resistor 38, couples the common node 36, between the transistors 34 and 35, to the driving point 39 of the variable delay inverter circuit. In order to vary the circuit delay in accordance with the error signal received via feedback line 13, suitable includes a summation network, sample means (not shown in this Figure.) must be provided in conjunction with either the resistor 30 or with the capacitor 33 or with both to vary their values and thus vary the overall delay of the circuit in accordance with the present invention.

Although the circuit shown in FIG. 3, depicts both the resistor 30 and the capacitor 33 as both being variable, it should be understood that, in some cases, it may be more desirable to have only one of these passive elements fixed and the other variable.

It should be noted that all the variable delay elements, i.e., element 18 in the oscillator 10, and element 22, in the variable delay inverter circuit 11, are identical to one another. Similarly, the inverters 19 and 23 are also identical to one another.

Selected variable delay circuits incorporating means for accomplishing this are set forth below in conjunction with FIGS. 4 to 9.

Figure 4:
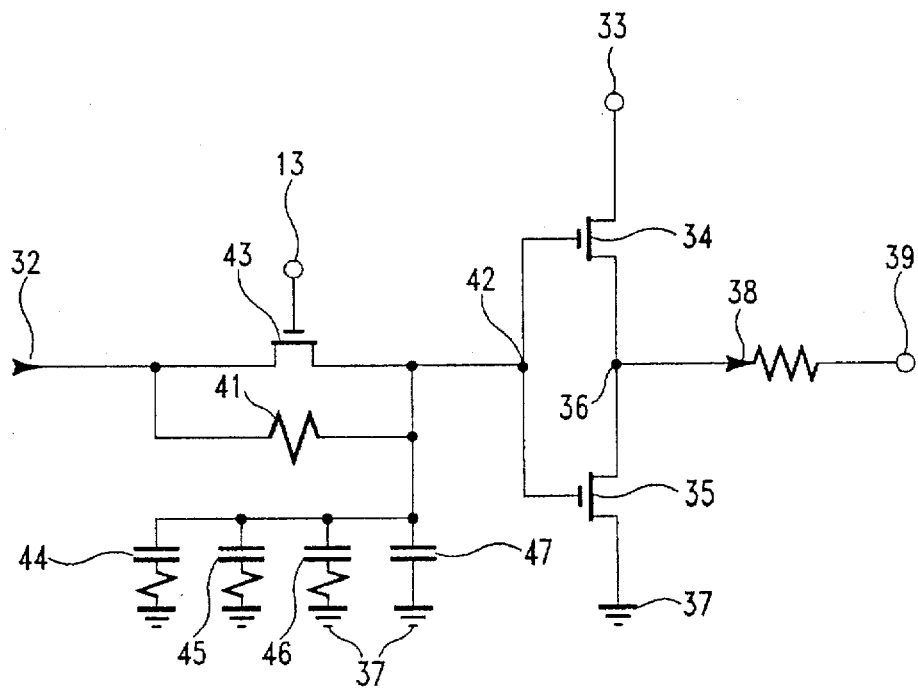
FIG. 4 is a schematic of another variable delay inverter useful in the present invention.

FIG. 4, depicts another embodiment of the variable delay inverter circuit of FIG. 3. In this FIG. 4, the variable delay element comprises a resistor 41, coupled between the input 32 and the common point 42, to which is coupled the gates of a matched pair of inverting transistors 34 and 35, a transistor 43 coupled across the resistor 41 and a plurality of capacitors 44, 45, 46, and 47 which are coupled between the common point 42 and ground 37. The gate of transistor 43 is coupled to the feedback line 13.

This variable delay element uses the FET to respond to the variations in the error signal, while the capacitors can be adjusted by treating with a laser beam or be made electrically programmable by coupling fuses thereto so that chip to chip process variations can be compensated for.

FIGS. 5, 6, 7, 8 and 9 show still other embodiments of the variable delay control element that may be used in the present invention.

Figure 5:
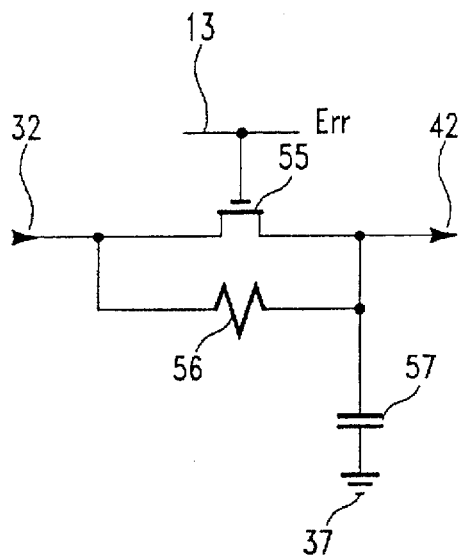
FIG. 5 is a schematic of a variable delay useful in the present invention.

FIG. 5 shows a variable delay control element comprised of a transistor 55 whose gate is coupled to the feedback line 13 and whose source and drain is respectively coupled between the input 32 and the node 42 and across a resistor 56. A capacitance 57 is coupled between the node 42 and ground 37.

Figure 6:
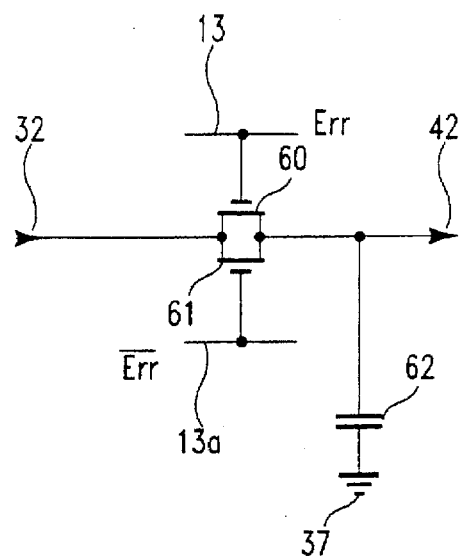
FIG. 6 is a schematic of another variable delay useful in the present invention.

FIG. 6 shows a variable delay control element comprised of a pair of complementary transistors, i.e., P channel transistor 61 and N channel transistor 60 whose gates are respectively coupled to feedback lines 13A and 13 and whose sources and drains are respectively coupled between the input line 32 and the node 42. The feedback line 13A is as discussed previously carrying a NOT error signal $\overline{Err}$ which is complimentary to the error signal Err carried by line 13. A capacitance 62 is coupled between the node 42 and ground 37.

Figure 7:
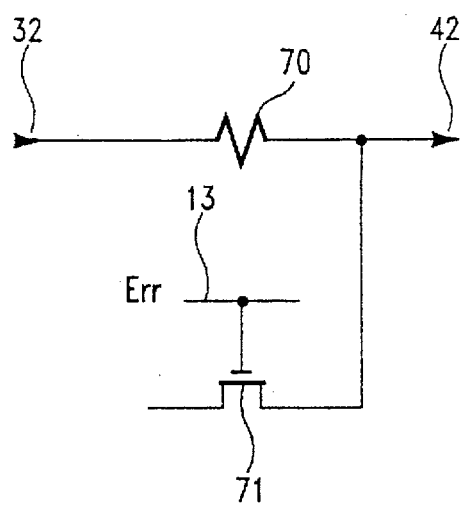
FIG. 7 is a schematic of a further variable delay useful in the present invention.

FIG. 7 shows a variable delay control element comprised of a resistor 70 coupled between the input 32 and the node 42 and an N channel transistor 71 whose gate is coupled to the feedback line 13 and one of whose source/drain diffusions is coupled to node 42 and whose other source/drain diffusion is open circuited.

Figure 8:
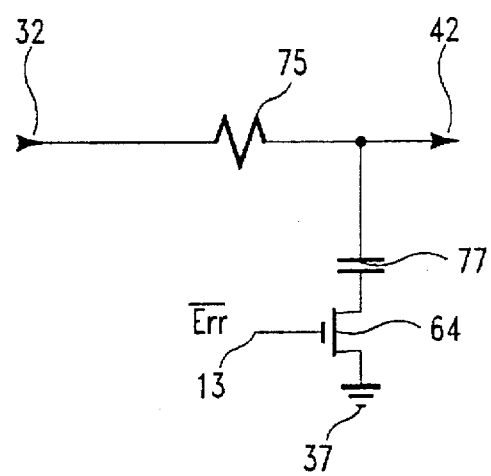
FIG. 8 is a schematic of a still further variable delay useful in the present invention.

FIG. 8 shows a variable delay control element comprised of a resistor 75 coupled between the input 32 and the node 42 and an N channel transistor 64 whose gate is coupled to the feedback line 13, whose source is coupled through a capacitor 77 to the node 42 and whose drain is connected to ground 37.

It should be noted that still other variable delay elements, suitable for the use in the present invention, are presently available in the prior art. A few such units are shown in U.S. Pat. No. 4,956,320; U.S. Pat No. 4,998,963 and U.S. Pat. No. 5,039,393.

Figure 9:
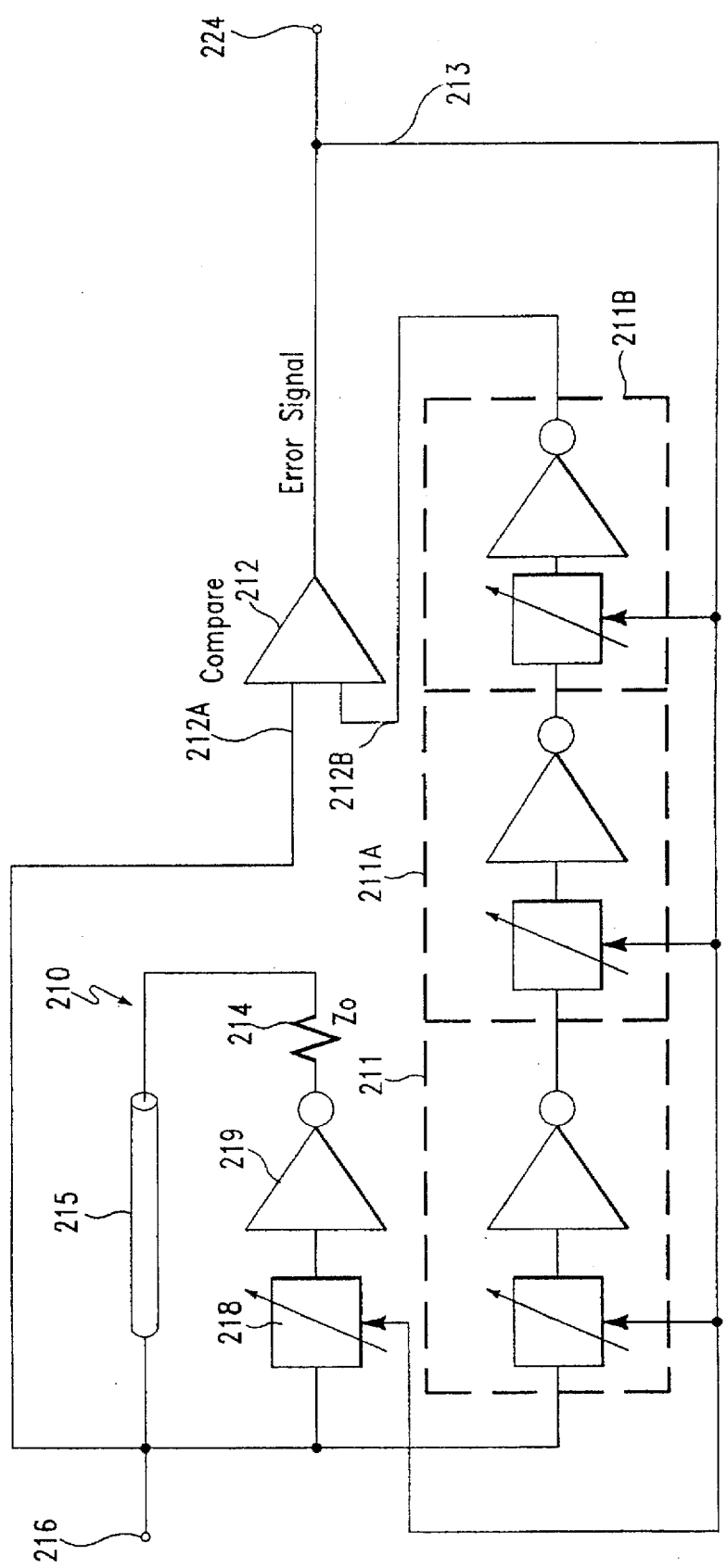
FIG. 9 is a schematic of another embodiment where the oscillator and the variable delay segments are separate.

FIG. 9 shows a further embodiment of the present invention wherein, the oscillator 210, is comprised of a delay line 215, connected to the oscillator input 216 and coupled through a series loop, comprising an impedance 214, a variable delay element 218, and an inverter 219, back to the oscillator input 216. The oscillator input 216 is coupled directly to a first input 212A of the comparator 212, and through the variable delay inverter circuits 211, 211A and 211B to a second input 212B, of the comparator 212 whose output 224 is coupled to the feedback line 213.

Figure 10:
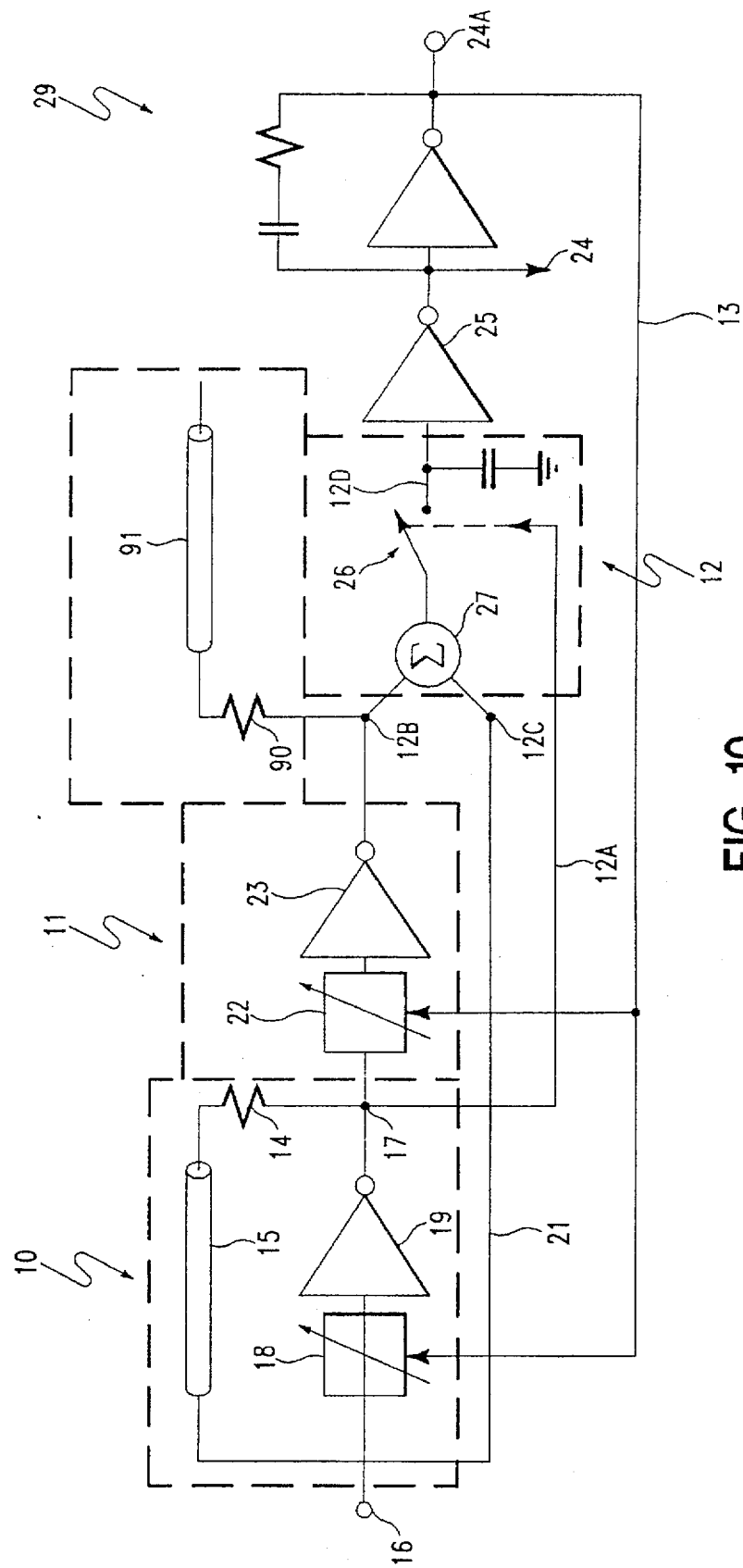
FIG. 10 shows the circuit of FIG. 2 with additional useful features.

FIG. 10 shows another embodiment of the circuit of the invention wherein there is coupled to the output of variable delay inverter circuit 11 an additional impedance 90, in series with a delay line stub 91. An additional frequency compensated amplifier 28 is also coupled between the amplifier 25 and the feedback line 13.

Again, the oscillator 10 is comprised of a delay line 15, coupled in series with an impedance 14, positioned between an input 16, and an output 17. A variable delay element 18, coupled in series with an inverter 19, is arranged, in parallel with the delay line 15 and the impedance 14, between the input 16 and the oscillator output 17. The output 17, of the oscillator 10, is coupled through the variable delay circuit 11, to a first input of the comparator circuit 12. The variable delay circuit 11 includes a variable delay element 22 and an inverter 23. The second input of the comparator 12 is again connected to the oscillator input 16. The output of the comparator 12 is coupled to the amplifier 25 whose output 24 will provide a NOT error signal. This output 24 is further coupled to the frequency compensated amplifier 29 Having an output 24A connected to feedback line 13. This design prevents "overshoot," "hunting" or other such instabilities in the output error signal fed to feedback line 13.

Figure 11:
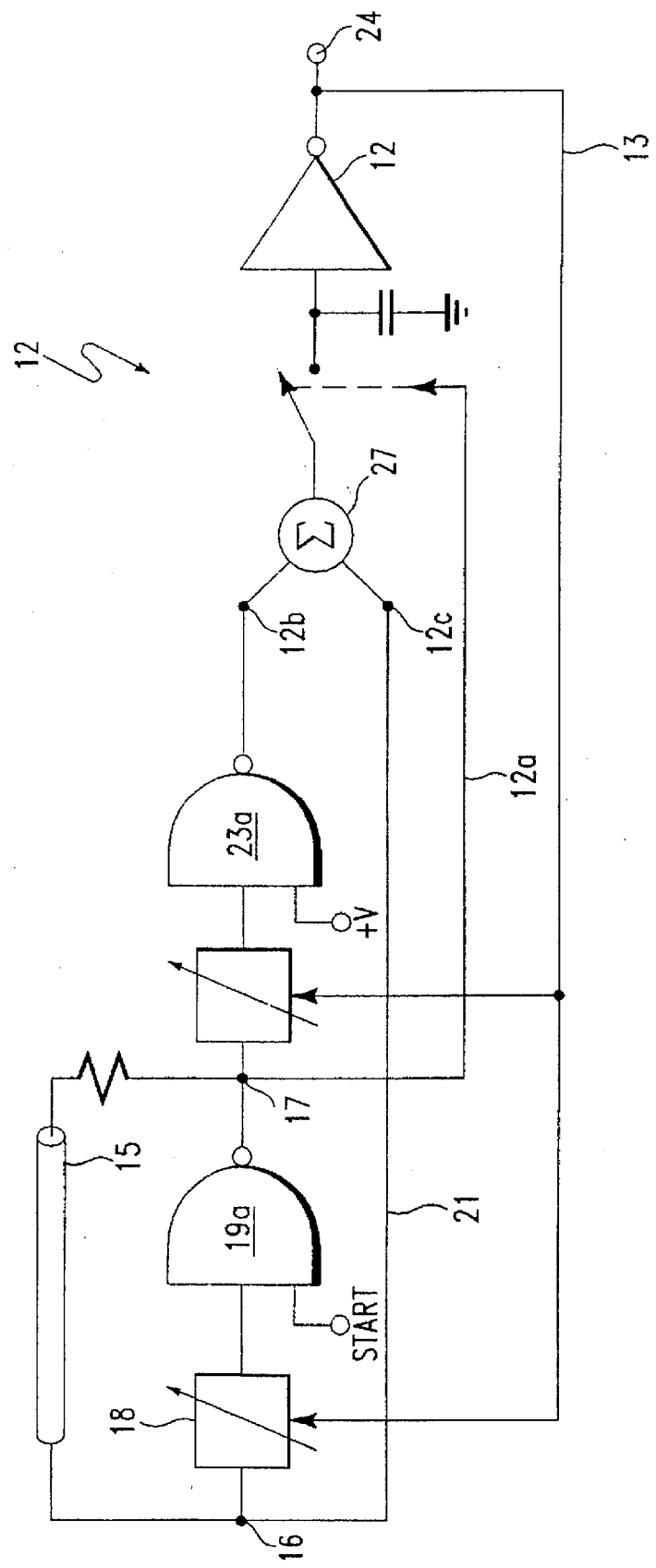
FIG. 11 shows the circuit of the present invention using NAND circuits in place of the inverter circuits.

FIG. 11 illustrates the circuit of FIG. 1, in which the inverters 19 and 23 in the oscillator 10 and the variable delay element 11 have been replaced by NAND gates 19A and 23A.

By using this circuit the oscillator may be started and stopped by the start input.

Typically the delay line of FIG. 11 has a delay of 0.5 nanoseconds and the microprocessor cycle is equal to 50 megahertz with a 20 nanosecond cycle. The microprocessor clock is determined counting down by ten times from the oscillator. Because many oscillator cycles comprise each clock cycle, in the first full clock cycle from startup the microprocessor clock would be 96% determined by the fixed delay of the transmission line and 4% by the delay of the inverter. Assuming that the inverter has process sensitivity tolerance of plus or minus 30% the first full clock cycle process sensitivity should be around 1-2%. The clock frequency recovery, after voltage supplied disturbance, should also be rapid. The benefit is achieved because the first corrective action of the error signal appears in two nanoseconds instead of twenty nanoseconds. The oscillator sensitivity to process variations can be still further reduced by introducing programmable elements.

In this circuit the NAND circuit can be replaced with a NOR circuit. Furthermore the variable delay could be more closely integrated into the inverter making the two functions less and distinct as previously discussed.

In many applications it may be necessary or desirable to adjust the frequency of the oscillation especially when the apparatus has been built into a semiconductor chip or module. For example, it may be necessary to fine tune the total delay through the delay line in a precision clock to compensate for second or third order effects such as voltage offset in the comparator amplification circuitry. Further Microprocessor clocks and timing chains may have to be adjusted for their most efficient operation with different support circuits. Still further, in a different application, one might wish to tune an autodyne receiver to a particular frequency.

Figure 12:
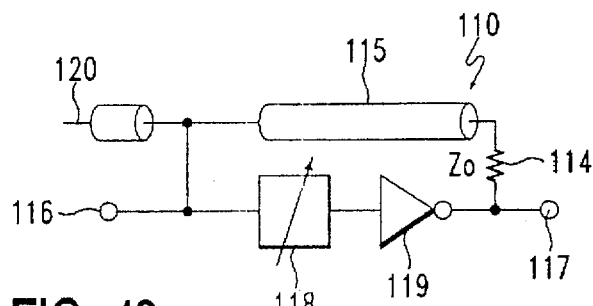
FIG. 12 shows a scheme of adjusting the frequency of the oscillator after fabrication.

FIG. 12 shows an oscillator 110, comprised of a delay line 115 terminated by an impedance 114 coupled between an input 116 and an output 117. A variable delay element 118 and an inverter 119 are coupled in parallel to the delay line 115 and the impedance 114. The oscillator 110 further has a stub transmission line 120 coupled to the input 116 of the oscillator 110. In this case the inverter 119 triggers on the first reflection from the un-terminated end and the frequency of the oscillator can be adjusted by comparison to a known precision standard (not shown) by trimming or otherwise adjusting the length of the stub transmission line 120 until the operating frequency of the oscillator 110 matches that of the standard to which it is being compared.

Figure 13:
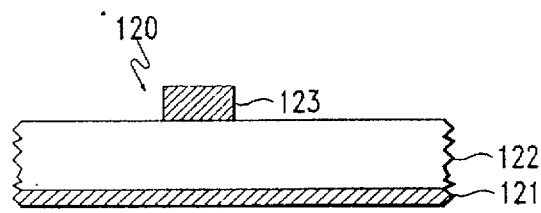
FIG. 13, shows a cross-section of an integrated circuit transmission line.

When the oscillator is made in an integrated circuit form the stub transmission line is, as shown in FIG. 13, formed of a metallic layer 121, i.e., ground, coated with a dielectric layer 122. On top of the layer 122 there is deposited a second metallic layer 123 which inter acts with the ground layer 121 to form the stub transmission line 120. Trimming of the stub transmission line may now be done by directing a laser beam (not shown) against the upper line 123 to alter its length and thus change the operating frequency of the stub 120. It should be noted that since this modification of the stub effectively shortens the length of the stub it will cause the frequency of the oscillator to become higher. Thus this technique can only tune the oscillator frequency in one direction.

Figure 14:
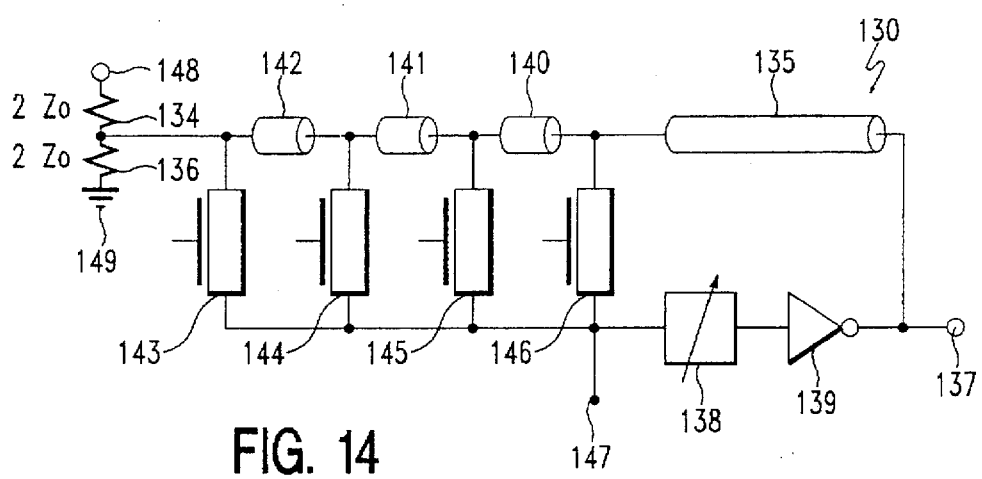
FIG. 14 show another scheme for adjusting the frequency of the oscillator.

FIG. 14 shows an oscillator 130, comprised of a delay line 135 coupled between an input 147 and an output 137. A variable delay element 138 and an inverter 139 are coupled in parallel to the delay line 135 and impedances 134 and 136. The oscillator 130 further has a plurality of stub transmission lines 140, 141, and 142 coupled to the one end of the delay line 135 and to the input 147 by a respective transistor 143, 144, 145, and 146. These lines are terminated by a pair of impedances 134 and 136. These impedances are equal to each other and together, in parallel, match the impedance of the transmission line. The impedance 134 is positioned between the transmission line and a voltage 148 while the impedance 136 is portioned between the line and ground 149. The frequency of the oscillator can be adjusted to compare to a known precision standard (not shown) by adding or deleting one or more of the stub transmission lines 140, 141, and 142 by selecting one of the coupling transistors 143, 144, 145, or 146 to be conductive. Also the selected transmission line stubs can be further trimmed or otherwise adjusted to more exactly match the operating frequency of the oscillator 130 to that of the standard to which it is being compared.

Figure 15:
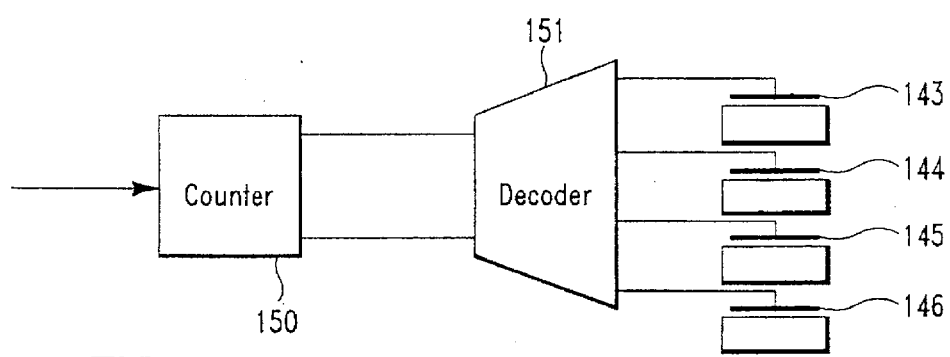
FIG. 15 illustrates, in schematic form a decoder for adjusting the frequency of the oscillator shown in FIG. 14.

FIG. 15 illustrates, in schematic form a counter driving a decoder for selecting the stubs 140, 141 and 142 of FIG. 14 by biasing on one or more of the coupling transistors 143, 144, 145 and 146.

Figure 16:
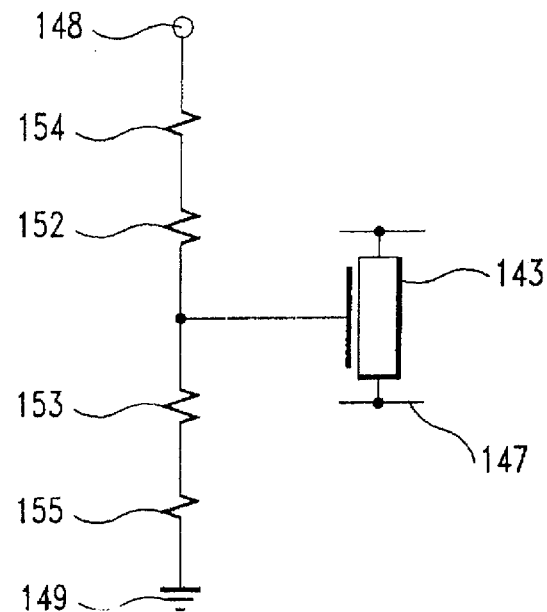
FIG. 16 shows another scheme for adjusting the frequency of the oscillator shown in FIG. 14.

FIG. 16 shows another scheme for selecting a coupling transistor shown in FIG. 14. For purposes of example only the coupling transistor 143 is shown. The selection circuit comprises a first resistor 152 in series with a first fuse 154 coupled between a voltage source 118 and the gate of the coupling transistor 143 and a second resistor 153 in series with a second fuse 155 coupled between the gate of the coupling transistor 143 and ground 149. One of the fuses 154 or 155 can be blown to select the coupling transistor 143.

Figure 17:
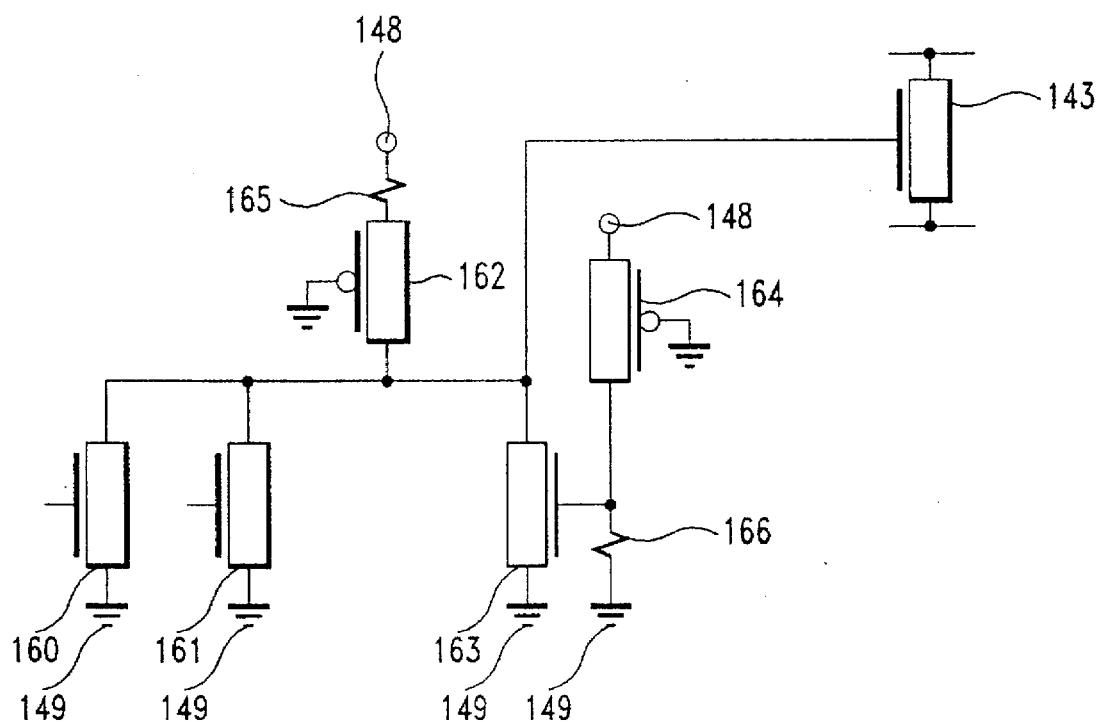
FIG. 17 shows still another scheme for adjusting the frequency of the oscillator shown in FIG. 14.

FIG. 17 shows the final stage of a decoder for selecting one of the coupling transistors, e.g., transistor 143. This final stage comprises a pair of decoder transistors 160 and 161 coupled between ground and the gate of the coupling transistor 143 and to the drain of a reference transistor 163 and the drain of a transistor 162 whose source is coupled through a fuse 165 to voltage source 148. The source of transistor 163 is coupled to ground 149 and its gate is coupled to ground through a second fuse 166 and to the voltage source 148 through a resistive transistor 164. Once the desired coupling transistor 143, 144, 145, or 146 has been determined by exercising the decoder, it can be permanently selected by blowing fuse 165 or 166.

Once a uniform and stable time standard is thus established on a semiconductor chip it can be used in any number of ways. The high frequency clock can be counted down and decoded to provide exact timing in some lower microprocessor clock. Master and slave latch techniques can be used to minimize timing skews generated by a ripple in the counter. The error signal may also be used to control the transmission delay through much longer timing chains with each inverter exhibiting a delay of one or one half that of the transmission line.

Although the invention has been particularly described with respect to the preferred embodiments and variations thereon, it should be understood that one skilled in the art can, from the forgoing, readily make changes in form and detail without departing from the spirit and scope of the invention.

What is claimed is:

1. A circuit comprising;
    a comparing means having first and second inputs and an output;
    an oscillator circuit means including a first inverter coupled to a delay line and to a first variable delay element, said first inverter, said delay line, and said first variable delay element cooperating to hold the frequency of the oscillator circuit means constant, and
    a delay inverter circuit comprising a second variable delay element coupled to a respective second inverter;
    the delay inverter circuit being coupled in common with the oscillator circuit means and being further coupled to the second input of the comparing means;
    said oscillator circuit means being coupled through the delay line to the first input of the comparing means and through the delay inverter circuit line to the second input of the comparing means;
    the comparing means sensing the phase difference between the output signal of the delay inverter circuit and the output signal of the oscillator circuit means and providing an error signal.

2. The circuit of claim 1 wherein the oscillator circuit means further includes a series of inverters and variable delay elements.

3. A circuit comprising;
    a comparing means having first and second inputs and an output;
    an oscillator means including an inverter coupled to a delay line and variable delay element, the inverter and the variable delay element cooperating to hold the frequency of the oscillator means constant, coupled to the first input of the comparing means; and
    a delay inverter circuit comprising a variable delay element coupled to a respective inverter;
    the delay inverter circuit being coupled in common with the oscillator means and being further coupled to the second input of the comparing means;
    the comparing means sensing the phase difference between the output signal of the delay inverter circuit and an output signal of the oscillator means and providing an error signal wherein said delay inverter circuit comprises a series of inverters and variable delay elements.

4. The circuit of claim 3 wherein said comparing means comprises a summation circuit.

5. The circuit of claim 4 wherein said comparing means further includes a sample and hold circuit.

6. The circuit of claim 1 wherein said comparing means comprises an amplifier.

7. An integrated circuit comprising;
    an oscillator means having an input, an output, a delay line and a variable delay element, said delay line and said variable delay element co-acting to hold the output signal frequency of said oscillator means substantially constant;
    a comparator having first and second inputs and an output;
    said input, of said oscillator means, being coupled to the first input of said comparator;
    a series of variable delay inverter circuits, said series of variable delay inverter circuits having an input and an output;
    the input of said series of variable delay inverter circuits being coupled to the input of the oscillator means;
    each of said variable delay inverter circuits in said series including a respective variable delay;
    the output of said series of variable delay inverter circuits being coupled to the second input of the comparator;
    said comparator circuit sensing the phase difference between the output signal of the series of variable delay inverter circuits and the input signal of the oscillator circuit and providing an error signal, at its output, proportional to said phase difference; and
    a feedback loop coupled to each variable delay inverter circuit in said series of variable delay inverter circuits and to the variable delay element in said oscillator to correct for said sensed phase difference and establish a uniform and stable time standard at said oscillator output.

8. The circuit of claim 3 wherein said delay line comprises a distributed inductance and a capacitive transmission line.

9. The circuit of claim 3 wherein said delay line comprises a lumped inductance and a capacitive transmission line.

10. The circuit of claim 1 wherein said delay line comprises a distributed resistance and a distributed capacitance.

11. The circuit of claim 1 wherein said delay line and said variable delay element are in common with the oscillator circuit means and a series of inverter means.

12. An integrated circuit comprising;
    an oscillator having an input, an output, an inverter, and a distributed inductance and capacitance transmission line and a variable delay element which vary together to hold the frequency of oscillation substantially constant;
    said output, of said oscillator, being coupled to the first input of a comparator circuit having two inputs and an output;
    a series of inverter means, each of which is coupled to a respective variable delay, coupled in parallel to the input of the oscillator and to a second input of said comparator circuit;
    said comparator circuit sensing the difference between the output signal of the inverter series and the output signal of the oscillator and providing an error signal, at its output, proportional to said difference; and
    a feedback loop coupled to the variable delay element in both said oscillator and in said inverter series to correct for said sensed difference to establish a uniform and stable time standard at said oscillator output.

13. The circuit of claim 3 wherein the comparing means and hold circuit and an amplifier.

14. The circuit of claim 3 wherein the oscillator means further includes a series of inverters and variable delay elements and there is a dummy load coupled to the output of the inverter series to modify the delay characteristics of the inverter series and make them more uniform.

15. The circuit of claim 3 wherein:
    said oscillator means comprises a NAND gate coupled to a delay line and a variable delay element, and said NAND gate and the variable delay element cooperate to hold the frequency of the oscillator means constant; and
    said delay inverter circuit comprises a variable delay element coupled to a respective NAND gate.

16. The circuit of claim 1 wherein said delay line in said oscillator circuit means is a fixed delay line.

* * * * *